(12) United States Patent
Takekoshi

(10) Patent No.: US 6,707,310 B2
(45) Date of Patent: Mar. 16, 2004

(54) NEEDLE LOAD MEASURING METHOD, NEEDLE LOAD SETTING METHOD AND NEEDLE LOAD DETECTING MECHANISM

(75) Inventor: Kiyoshi Takekoshi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/360,811

(22) Filed: Feb. 10, 2003

(65) Prior Publication Data

US 2003/0117160 A1 Jun. 26, 2003

Related U.S. Application Data

(63) Continuation of application No. 09/776,686, filed on Feb. 6, 2001, now abandoned.

(30) Foreign Application Priority Data

Feb. 15, 2000 (JP) ........................................ 2000-036361

(51) Int. Cl.$^7$ ........................ G01R 31/00; G01B 21/22; B65G 49/07
(52) U.S. Cl. ...................... 324/758; 324/158.1; 33/533; 414/936
(58) Field of Search ................................ 324/754, 757, 324/758, 158.1; 33/533, 568, 645; 414/936; 702/98; 700/301

(56) References Cited

U.S. PATENT DOCUMENTS

| | | | |
|---|---|---|---|
| 4,934,064 A | 6/1990 | Yamaguchi et al. | ......... 33/645 |
| 5,410,259 A | 4/1995 | Fujihara et al. | ............. 324/758 |
| 5,436,571 A | 7/1995 | Karasawa | .................... 324/765 |
| 5,642,056 A | 6/1997 | Nakajima et al. | ........... 324/758 |
| 5,773,987 A | 6/1998 | Montoya | ..................... 324/752 |
| 5,777,485 A | 7/1998 | Tanaka et al. | ............... 324/757 |
| 5,804,983 A | 9/1998 | Nakajima et al. | ........... 324/758 |
| 5,872,458 A | 2/1999 | Boardman et al. | .......... 324/758 |
| 6,037,793 A | 3/2000 | Miyazawa et al. | .......... 324/760 |
| 6,297,656 B1 | 10/2001 | Kobayashi et al. | ......... 324/758 |

FOREIGN PATENT DOCUMENTS

| | | |
|---|---|---|
| JP | 2818363 | 3/1995 |
| JP | 2000-252304 | 9/2000 |

*Primary Examiner*—Kamand Cuneo
*Assistant Examiner*—Paresh Patel
(74) *Attorney, Agent, or Firm*—Oblon, Spivak, McClelland, Maier & Neustadt, P.C.

(57) ABSTRACT

Disclosed is a method of inspecting the electrical characteristics of a to-be-inspected object formed on a wafer under the state that the wafer chuck having the wafer placed thereon is overdriven by a lift mechanism, wherein measured is the sinking amount of the wafer chuck caused by the needle load applied from a plurality of probes of a probe card to the wafer chuck. Also disclosed are a needle load measuring method for measuring the applied needle load from the sinking amount, a needle load setting method, and a needle load detecting mechanism.

10 Claims, 4 Drawing Sheets

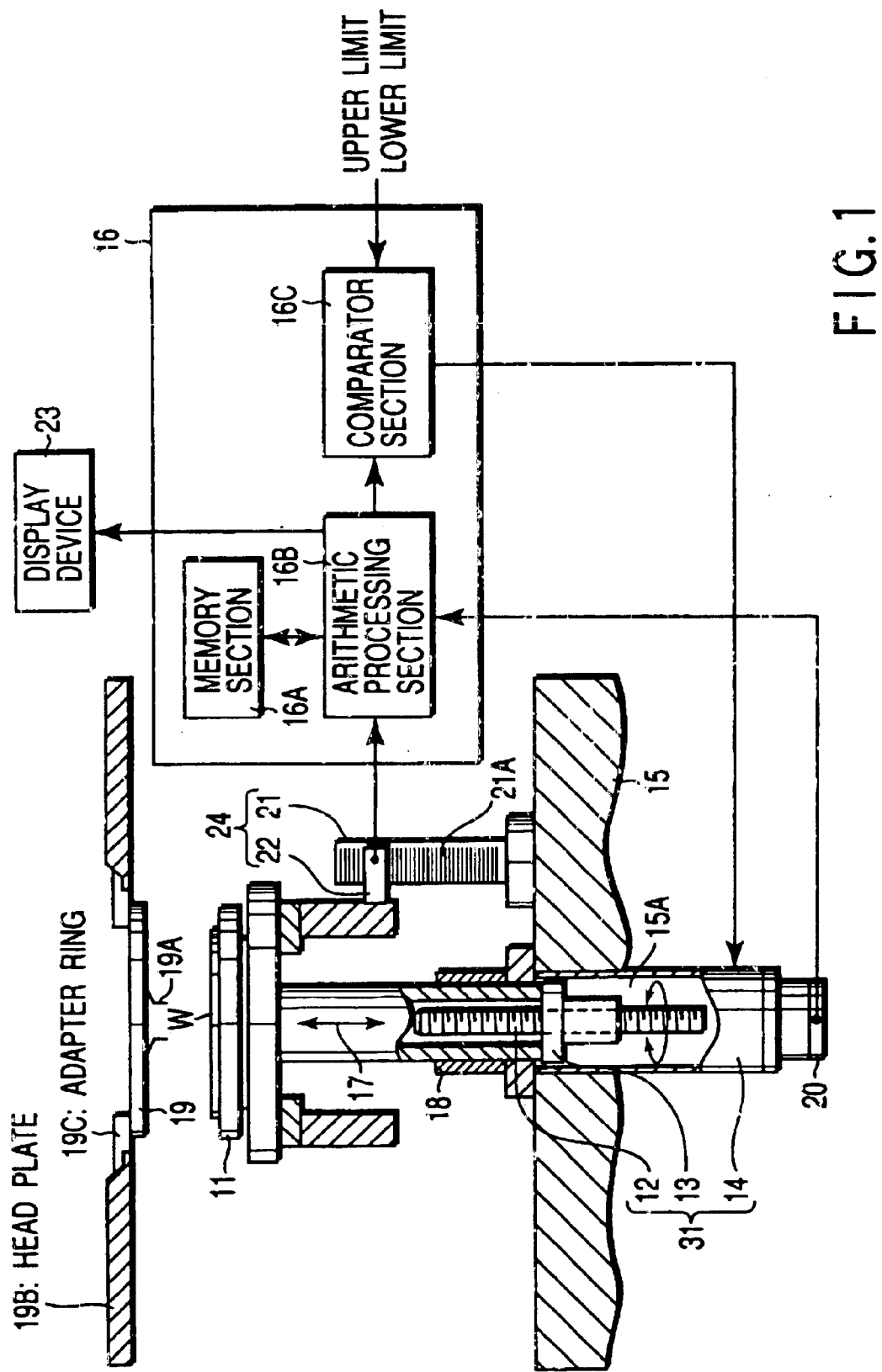
F I G. 1

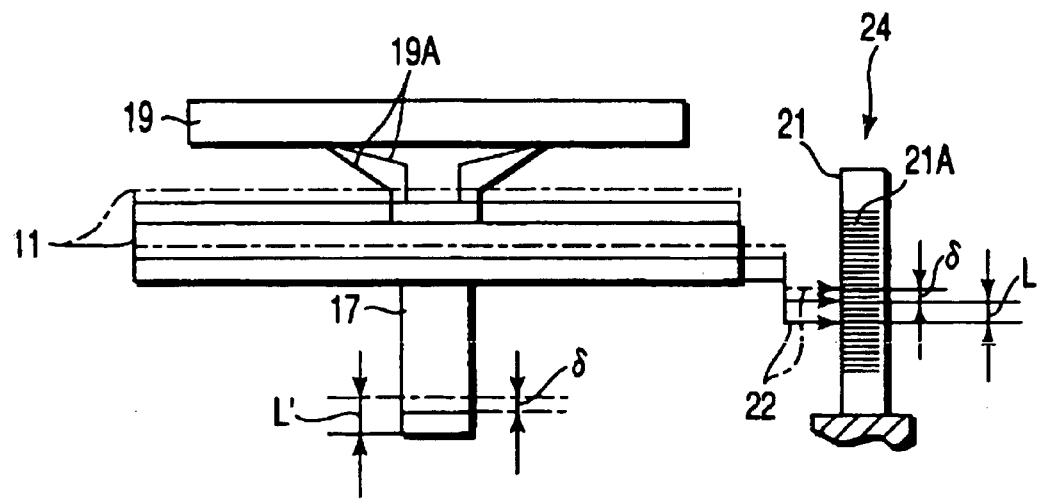
F I G. 2
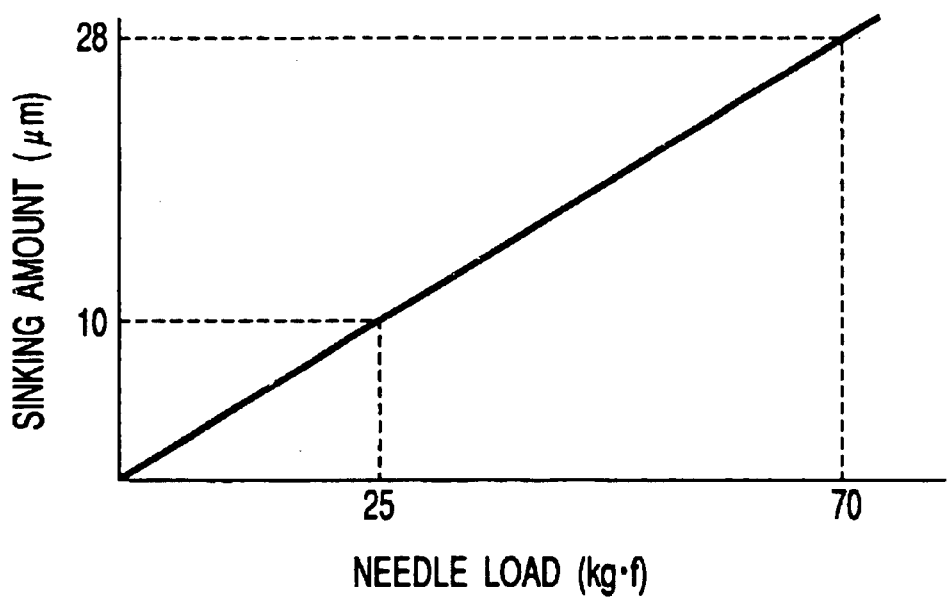
F I G. 3

NEEDLE LOAD MEASURING METHOD, NEEDLE LOAD SETTING METHOD AND NEEDLE LOAD DETECTING MECHANISM

This application is a Continuation of application Ser. No. 09/776,686 Filed on Feb. 6, 2001, now abandoned.

CROSS-REFERENCE TO RELATED APPLICATIONS

This application is based upon and claims the benefit of priority from the prior Japanese Patent Application No. 2000-036361, filed Feb. 15, 2000, the entire contents of which are incorporated herein by reference.

BACKGROUND OF THE INVENTION

The present invention relates to a needle load measuring method, a needle load setting method and a needle load detecting mechanism, particularly, to a method and a mechanism for measuring on the real time basis the needle load applied to a wafer chuck by a probe in the inspecting step and a needle load setting method for setting an appropriate needle load.

A probe apparatus is widely used for inspecting the electrical characteristics of electric circuits formed on a to-be-inspected object, e.g., a wafer. As shown in FIG. 4, the conventional probe apparatus comprises a wafer chuck 1 on which a wafer W is placed, an X-stage 2 for supporting the wafer chuck 1, a Y-stage 3 for supporting the X-stage 2, and a base table 4 for supporting the X-stage 2 and Y-stage 3. When the electrical characteristics of the wafer W are inspected, the wafer chuck 1 is moved in the X- and Y-directions via the X-stage 2 and the Y-stage 3 and is also moved in a vertical direction by a vertical driving mechanism, e.g., member 31 shown in FIG. 1. The X-stage 2 performs a reciprocating movement on the Y-stage 3 along a rail 6 extending in an X-direction via a driving mechanism 5 in the X-direction. On the other hand, the Y-stage 3 performs a reciprocating movement on the base table 4 along a rail 8 extending in a Y-direction via a driving mechanism 7 in the Y direction. The driving mechanism 5 in the X-direction comprises a motor (not shown), and a ball screw 5B. Likewise, the driving mechanism 7 in the Y-direction comprises a motor 7A and a ball screw 7B. The ball screws 5B and 7B are engaged with the X-stage 2 and the Y-stage 3, respectively, so as to move the X- and Y stages 2 and 3. The wafer chuck 1 is moved in the Z direction via the vertical driving mechanism so as to bring the wafer W placed on the wafer chuck 1 into an electrical contact with a plurality of probes 9A of a probe card 9 arranged above the wafer chuck 1. The electrical characteristics of IC chips formed on the wafer W are inspected by the plural probes 9A. During the inspection, the overdriving amount of the wafer chuck 1 is controlled at a predetermined value so as to permit the wafer W to be brought into an electrical contact with the probes 9A.

It is desirable for the overdriving amount to be defined for each probe card 9 in conformity with, for example, the characteristics of the probes 9A. By setting the overdriving amount on the basis of the defined value, the needle load in the inspecting step can be set at a predetermined value. Reference numerals 10A and 10B shown in FIG. 4 denote aligning mechanisms for aligning the position of the wafer W with the position of the probe card 9.

BRIEF SUMMARY OF THE INVENTION

In the conventional inspecting apparatus, the overdriving amount once set is maintained constant until the inspection is finished. A head plate 19B and an adapter ring 19C, to which the probe card is mounted, are considered to be thermally deformed under the influence of, for example, the heat generated from the wafer chuck during the inspection. By the thermal deformation, the magnitude of the needle load is changed over the entire region or a part of the wafer chuck. At the place where the needle load has been diminished, the contact between the wafer and the probes is rendered poor. On the other hand, at the place where the needle load has been increased, the probe card is likely to be damaged.

An object of the present invention is to overcome the above-noted problems inherent in the prior art.

Another object of the present invention is to monitor on the real time basis the contact state (needle load) between a to-be-inspected object, i.e., a wafer, and the probe.

Another object of the present invention is to prevent a damage done to, for example, a probe card.

Further, still another object of the present invention is to provide an improved needle load measuring method, an improved needle load setting method and an improved needle load inspecting mechanism.

According to a first aspect of the present invention, there is provided a method of measuring the needle load applied by a plurality of probes to a wafer chuck in inspecting the electrical characteristics of a to-be-inspected object by using a probe apparatus, comprising the steps of:

overdriving a wafer chuck having a to-be-inspected object mounted thereon by using a wafer chuck lift mechanism so as to bring the to-be-inspected object into contact with a plurality of probes of the probe apparatus; and measuring the sinking amount of the wafer chuck caused by the needle load applied by the plural probes to the wafer chuck via the to-be-inspected object when the to-be-inspected object is brought into contact with the plural probes;

wherein the needle load corresponding to the measured sinking amount is obtained on the basis of the data showing the relationship between the needle load applied to the wafer chuck and the sinking amount of the wafer chuck caused by the needle load.

According to a second aspect of the present invention, there is provided a method of setting a needle load applied by a plurality of probes to a to-be-inspected object at a predetermined value in inspecting the electrical characteristics of the to-be-inspected object by overdriving a wafer chuck having the to-be-inspected object mounted thereon in a probe apparatus so as to bring the to-be-inspected object into an electrical contact with the plural probes, comprising the step of:

detecting the sinking amount of the wafer chuck caused by the needle load applied by the plural probes in the process of overdriving the wafer chuck;

wherein the needle load applied to the to-be-inspected object mounted on the wafer chuck is set at a predetermined value by setting the sinking amount detected in the step at a sinking amount corresponding to a predetermined needle load on the basis of the data showing the relationship between the needle load applied to the wafer chuck and the sinking amount of the wafer chuck caused by the needle load.

In the method according to each of the first and second aspects of the present invention described above, it is desirable for the sinking amount of the wafer chuck to be measured at a plurality of points of the wafer chuck.

In the method according to each of the first and second aspects of the present invention described above, it is desirable for the wafer chuck having the to-be-inspected object mounted thereon to be overdriven by a lift mechanism comprising a ball screw, a driving mechanism for rotating the ball screw and a nut member.

In the method according to each of the first and second aspects of the present invention described above, it is desirable for the step of measuring the sinking amount to comprise the sub-steps of:

detecting a pseudo overdriving amount of the wafer chuck performed by the lift mechanism, the pseudo overdriving amount being the overdriving amount of the wafer chuck performed by the lift mechanism when the needle load is not applied to the wafer chuck;

detecting the actual overdriving amount of the wafer chuck performed by the lift mechanism, the actual overdriving amount being the actual overdriving amount of the wafer chuck performed by the lift mechanism when the needle load is applied to the wafer chuck; and obtaining the sinking amount of the wafer chuck from the difference between the pseudo overdriving amount and the actual overdriving amount.

In the method described above, it is desirable for the step of detecting the pseudo overdriving amount to comprise the process of detecting the pseudo overdriving amount on the basis of the amount of rotation of the driving mechanism for rotating the ball screw measured by a rotary encoder.

In the method described above, it is desirable for the step of detecting the actual overdriving amount to comprise the process of detecting the actual overdriving amount of the wafer chuck by a linear encoder.

According to a third aspect of the present invention, there is provided a probe apparatus for inspecting the electrical characteristics of a to-be-inspected object, comprising:

a wafer chuck for mounting a to-be-inspected object thereon;

a lift mechanism for vertically moving the wafer chuck;

a plurality of probes brought into an electrical contact with a plurality of electrodes of the to-be-inspected object mounted on the wafer chuck overdriven by the lift mechanism;

a measuring mechanism for measuring the sinking amount of the wafer chuck caused by the needle load applied by the plural probes to the to-be-inspected object when the wafer chuck is overdriven to bring the to-be-inspected object mounted on the wafer chuck into contact with the plural probes; and a needle load detecting mechanism for obtaining the needle load corresponding to the measured sinking amount on the basis of the data showing the relationship between the needle load applied to the wafer chuck and the sinking amount of the wafer chuck.

In the measuring mechanism of the probe apparatus described above, it is desirable for the sinking amount of the wafer chuck to be measured at a plurality of points of the wafer chuck.

It is desirable for the lift mechanism of the probe apparatus described above to comprise a ball screw, a driving mechanism for rotating the ball screw and a nut member.

It is desirable for the measuring mechanism of the probe apparatus for measuring the sinking amount to comprise:

a first lift amount detecting mechanism for detecting a pseudo lift amount of the wafer chuck performed by the lift mechanism, the first lift amount detecting mechanism detecting a pseudo overdriving amount that the lift mechanism may overdrive the wafer chuck when the needle load is not applied to the wafer chuck;

a second lift amount detecting mechanism for detecting the actual overdriving amount of the wafer chuck performed by the lift mechanism, the second lift amount detecting mechanism detecting the actual overdriving amount of the wafer chuck performed by the lift mechanism when the needle load is applied to the wafer chuck;

a calculating mechanism for obtaining the sinking amount of the wafer chuck from the difference between the pseudo overdriving amount detected by the first lift amount detecting mechanism and the actual overdriving amount detected by the second lift amount detecting mechanism;

a storing device for storing the data showing the relationship between the needle load applied to the wafer chuck and the sinking amount of the wafer chuck caused by the needle load; and a needle load detecting mechanism for obtaining the needle load corresponding to the sinking amount of the wafer chuck obtained by the calculating mechanism on the basis of the data showing the relationship between the needle load applied to the wafer chuck and the sinking amount of the wafer chuck caused by the needle load.

In the probe apparatus of the present invention, it is desirable for the measuring mechanism of the sinking amount to comprise:

a first lift amount detecting mechanism for detecting a pseudo lift amount of the wafer chuck performed by the lift mechanism, the first lift amount detecting mechanism detecting a pseudo overdriving amount that the lift mechanism may overdrive the wafer chuck when the needle load is not applied to the wafer chuck;

a second lift amount detecting mechanism for detecting the actual overdriving amount of the wafer chuck performed by the lift mechanism, the second lift amount detecting mechanism detecting the actual overdriving amount of the wafer chuck performed by the lift mechanism when the needle load is applied to the wafer chuck;

a calculating mechanism for obtaining the sinking amount of the wafer chuck from the difference between the pseudo overdriving amount detected by the first lift amount detecting mechanism and the actual overdriving amount detected by the second lift amount detecting mechanism;

a storing device for storing the data showing the relationship between the needle load applied to the wafer chuck and the sinking amount of the wafer chuck caused by the needle load; and a needle load detecting mechanism for obtaining the needle load corresponding to the sinking amount of the wafer chuck obtained by the calculating mechanism on the basis of the data showing the relationship between the needle load applied to the wafer chuck and the sinking amount of the wafer chuck caused by the needle load.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view showing a main portion of an inspecting apparatus according to one embodiment of the present invention;

FIG. 2 is for describing the operation of the inspecting apparatus shown in FIG. 1;

FIG. 3 is a graph showing the relationship between the needle load and the sinking amount of a ball screw in the inspecting apparatus shown in FIG. 1;

DETAILED DESCRIPTION OF THE INVENTION

Figure 4:
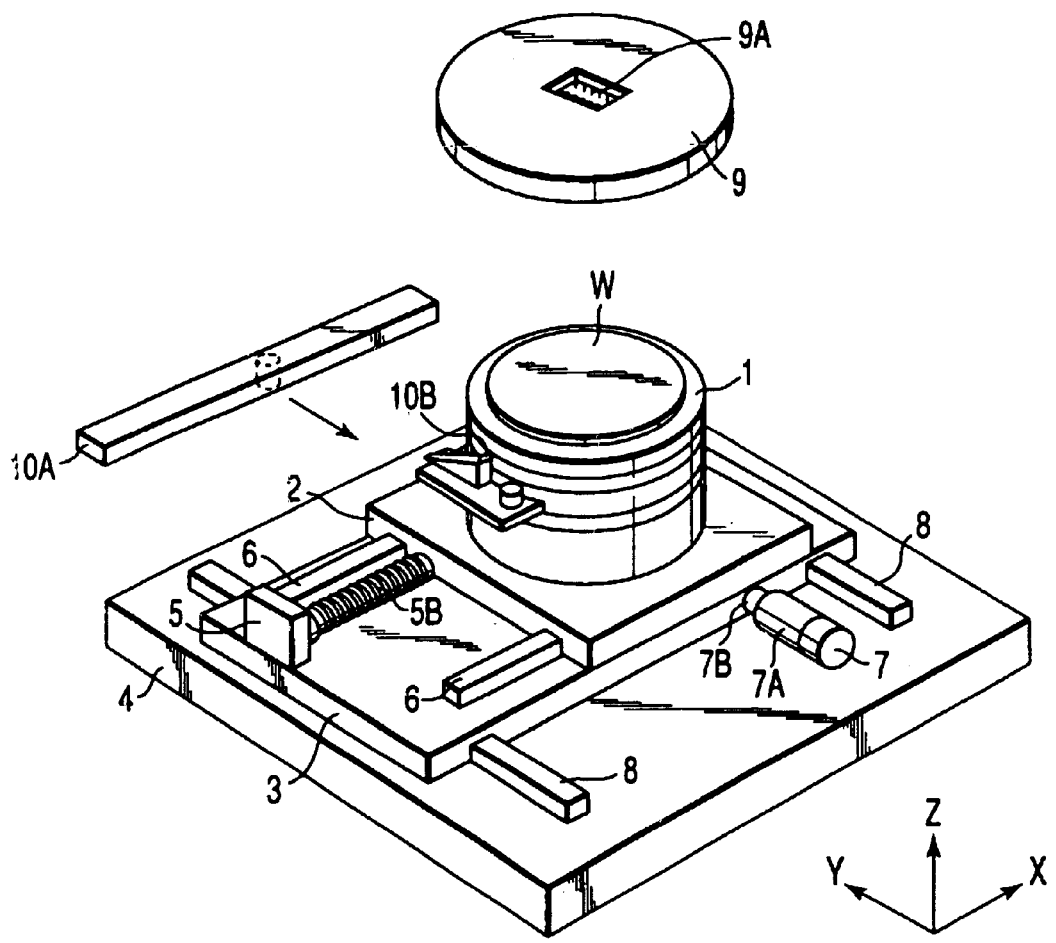
FIG. 4 is an oblique view showing a main portion of a conventional inspecting apparatus.

The present invention will now be described with reference to the embodiment shown in FIGS. 1 to 3. As shown in FIG. 1, the inspecting apparatus in this embodiment comprises a wafer chuck 11 on which a wafer W is placed, a lift mechanism 31 of the wafer chuck 11 including a ball screw 12, a nut section 13 and a motor 14, an X-stage 15 supporting these members, and a control device 16 for controlling a driving mechanism such as the motor 14. A hole 15A is formed in substantially the center of the X-stage 15. The motor 14 can be arranged within the hole 15A. It is also possible for the motor 14 to be arranged on the X-stage 15.

The ball screw 12 is joined to the motor 14 and extends upward through the hole 15A so as to be engaged with the nut member 13. The nut member 13 is moved upward or downward in accordance with rotation of the ball screw 12 in the clockwise direction and the counterclockwise direction. The nut member 13 is mounted to the lower end of a hollow Z-shaft 17 extending downward from the center in the lower surface of the wafer chuck 11. The ball screw 12 engaged with the nut member 13 is arranged within the Z-shaft 17. The wafer chuck 11 moves upward or downward via the ball screw 12, the nut member 13 and the Z-shaft 17 in accordance with rotation of the motor 14 in the clockwise direction and the counterclockwise direction. The Z-shaft 17 extending downward from the wafer chuck 11 is movable upward and downward in the vertical direction within a Z-shaft 18 mounted to the X-stage 15.

As shown in FIG. 1, a probe card 19 having a plurality of probes 19A is arranged above the wafer chuck 11. The wafer W is brought into an electrical contact with the probe 19A if the wafer chuck 11 is overdriven above the X-stage 15 by a lift mechanism 31. The electrical characteristics of an IC chip formed in the wafer W are inspected by a tester connected to the probe 19A.

As shown in FIG. 1, a rotary sensor 20 is mounted to the motor 14. The rotary sensor 20, e.g., a rotary encoder, detects the lift amount, i.e., a pseudo overdriving amount, that must have been overdriven by the wafer chuck 11. It is possible to employ a rotary encoder or a resolver as the rotary sensor. The rotary sensor is hereinafter referred to as the "rotary encoder". A linear scale 21 is arranged on the X-stage 15. Also, a linear sensor 22 is mounted to the wafer chuck 11. The graduation 21A of the linear scale 21 is read by the linear sensor 22 and the linear scale 21 so as to detect the actual overdriving amount of the wafer chuck 11. The linear scale 21 and the linear sensor 22 are collectively referred to herein later as "a linear encoder 24".

When the wafer chuck 11 is brought into an electrical contact with a plurality of probes 19A by the overdriving, the wafer chuck 11 is caused to sink slightly by the needle load from the plural probes 19A. To be more specific, as shown in FIG. 1, the wafer chuck 11 is moved upward in the Z-direction by the lift mechanism including the motor 14, the ball screw 12 and the nut 13 so as to be brought into contact with the plural probes 19A. Further, if the wafer chuck 11 is overdriven, a needle load is applied from the plural probes 19A to the wafer W. Since the nut member 13 fixed to the lower end of the Z-shaft 17 is engaged with the ball screw 12, the ball screw 12 receives the needle load through the nut member 13. In this step, a compression force is generated between the ball screw 12 and the nut member 13 so as to elastically deform the nut member 13. As a result, the wafer chuck 11 is displaced vertically downward, as schematically shown in FIG. 2. To be more specific, the wafer chuck 11 is overdriven from the position denoted by a thick line to a position denoted by a dot-and-dash line (pseudo overdriving amount of L'), as shown in FIG. 2. However, since the nut member 13 is elastically deformed by the needle load, the wafer chuck 11 is caused to sink from the position denoted by the dot-and-dash line to a position denoted by a thin line. As a result, the actual overdriving amount L detected by the linear encoder 24 is made smaller by a sinking amount δ than the pseudo overdriving amount L' detected by the rotary encoder 20. In other words, the difference δ is generated between the pseudo overdriving amount L' and the actual overdriving amount L. For preventing the linear encoder 24 from receiving the influence given by the change in temperature, it is effective to allow a fluid for maintaining the temperature such as the air to flow through the linear encoder. In the present invention, the apparatus for measuring the actual overdriving amount is not limited to the apparatus shown in FIG. 2. It is possible to employ any apparatus that permits accurately measuring the actual overdriving amount of the wafer chuck 11.

The relationship between the needle load and the sinking amount δ has been analyzed. Specifically, the sinking amount δ has been detected by using the rotary encoder 20 and the linear encoder 24 every time the load applied to the wafer chuck 11 has been changed. It has been clarified that there is a relationship as shown in, for example, FIG. 3 between the needle load and the sinking amount δ. It is possible to store the particular relationship in a memory section 16A of the control device 16 in the form of a numerical formula or a table. A difference (sinking amount δ) between the pseudo overdriving amount detected by the rotary encoder 20 and the actual overdriving amount detected by the linear encoder 24 is obtained in an arithmetic processing section 16B of the control device 16. The needle load corresponding to the sinking amount δ is obtained on the basis of the relationship shown in FIG. 3 between the needle load and the sinking amount δ and the needle amount thus obtained is displayed in a display apparatus 23. As a result, it is possible to grasp the needle load applied to the wafer chuck 11 on the real time basis. By contraries, it is possible to set a desired needle load from the sinking amount δ on the basis of the relationship shown in FIG. 3. For example, when a needle load of 25 kg·f is set, it is necessary to set the sinking amount δ at 10 μm. The needle load can be set at a predetermined value by controlling the lift mechanism 31 to achieve the sinking amount δ. The relationship between the needle load and the sinking amount δ is caused to change by the diameter of the screw, lead, the number of windings of the screw groove of the nut member, the ball diameter, etc. It is desirable for the relationship between the needle load and the sinking amount δ to be obtained for each inspecting apparatus when the inspecting apparatus is assembled. It is also desirable to set in advance the upper limit and the lower limit of an allowable range of the needle load in, for example, the display device 23. In this case, when the needle load has exceeded or is likely to exceed the allowable range, a comparator section 16C judges the particular situation so as to rotate the motor 14 in the opposite direction or stop the rotation of the motor 14 so as to prevent the needle load from exceeding the allowable range. As a result, it is possible to prevent in advance the probe card 19 from being damaged by an overload.

The detecting accuracy of the sinking amount δ is dependent on the resolution of the driving section of the motor 14 and on the resolution of the linear encoder 24. For example, if the resolution of each of the driving section of the motor 14 and the linear encoder 24 is assumed to be 0.1 μm, the resolution of the needle load is 0.25 kg·f. Recently, the resolution of the linear encoder 24 has been improved to about $8 \times 10^{-5}$ μm. Therefore, the resolution of the needle load can be increased to 0.2 g·f by using a servo motor provided with a rotary encoder of a high resolution as the motor 14.

The method of measuring the needle load in this embodiment will now be described. In the first step, the wafer W is placed on the wafer chuck 11 and the position of the wafer W is aligned with the position of the probe card 19 by an aligning mechanism. The wafer W is moved in the X- and Y-directions so as to be brought back to the original position. In this position, the wafer chuck 11 is moved upward by the lift mechanism 31. After the wafer chuck 11 is moved upward so as to bring the wafer W into contact with the probes 19A, the wafer chuck 11 is further overdriven. The rotary encoder 20 detects the pseudo overdriving amount L' caused by the motor driving and, then, the detected value is supplied to the arithmetic calculating section 16B of the control device 16. The linear encoder 24 permits the linear sensor 22 to detect the actual overdriving amount L. The detected value is supplied to the arithmetic calculating section 16B of the control device 16. The sinking amount δ is obtained in the arithmetic calculating section 16B on the basis of the detected values L, L' and the needle load corresponding to the sinking amount δ is obtained on the basis of the relationship shown in FIG. 3. In this fashion, the needle load can be grasped on the real time basis. Also, it is possible to know the distribution state of the needle load in the inspecting step by sequentially recording the needle load in the memory section 16A. When the probe card 19 is thermally deformed during the inspection so as to cause the needle load to exceed the allowable range, the motor 14 is rotated in the opposite direction via the comparator section 16C, making it possible to perform the subsequent inspection under the state that the needle load is corrected to fall within the allowable range. It follows that the probe card is prevented in advance from being damaged.

Another embodiment of the present invention will now be described with reference to FIG. 5. The embodiment of the present invention shown in FIG. 5 differs from the mechanism shown in FIG. 1 in that, in FIG. 5, a plurality of lift mechanisms are employed for vertically moving the wafer chuck 11. To be more specific, the wafer chuck 11 on which the wafer W is placed is moved in the vertical direction by a plurality of, e.g., two or three, lift mechanisms 31 each comprising the ball screw 12, the nut member 13 and the motor 14 in the embodiment shown in FIG. 5. The control device for controlling the driving mechanism such as the motor 14 is substantially equal in construction to the control device shown in FIG. 1 and, thus, is not shown in FIG. 5. In this embodiment, the motor 14 is arranged in the lateral position of the ball screw 12, and the driving force of the motor 14 is transmitted to the ball screw 12 by a driving force transmitting mechanism 35. The motor 14 may be arranged within the hole 15A formed in substantially the center of the X-stage 15, as shown in FIG. 1. The ball screw 12 rotated by the motor 14 is engaged with the nut member 13. The nut member 13 is moved upward or downward along the ball screw 12 by the rotation of the ball screw 12 in the forward and backward directions. The nut member 13 is mounted to the lower end of a hollow cylinder 17' extending downward from the center in the lower surface of the wafer chuck 11. The ball screw 12 engaged with the nut member 13 is arranged within the cylinder 17'. The wafer chuck 11 is moved upward or downward via the ball screw 12, the nut member 13 and the cylinder 17' in accordance with rotation of the motor 14 in the forward and backward directions. The Z-shaft 17 extending downward from the wafer chuck 11 is movable in the vertical direction along a Z-shaft guide 33 mounted to the X-stage 15. A reference numeral 34 shown in FIG. 5 denotes a substrate to which the Z-shaft guide 33 is fixed, and a reference numeral 32 denotes a roller bearing (steel balls) of the Z-shaft guide.

Figure 5:
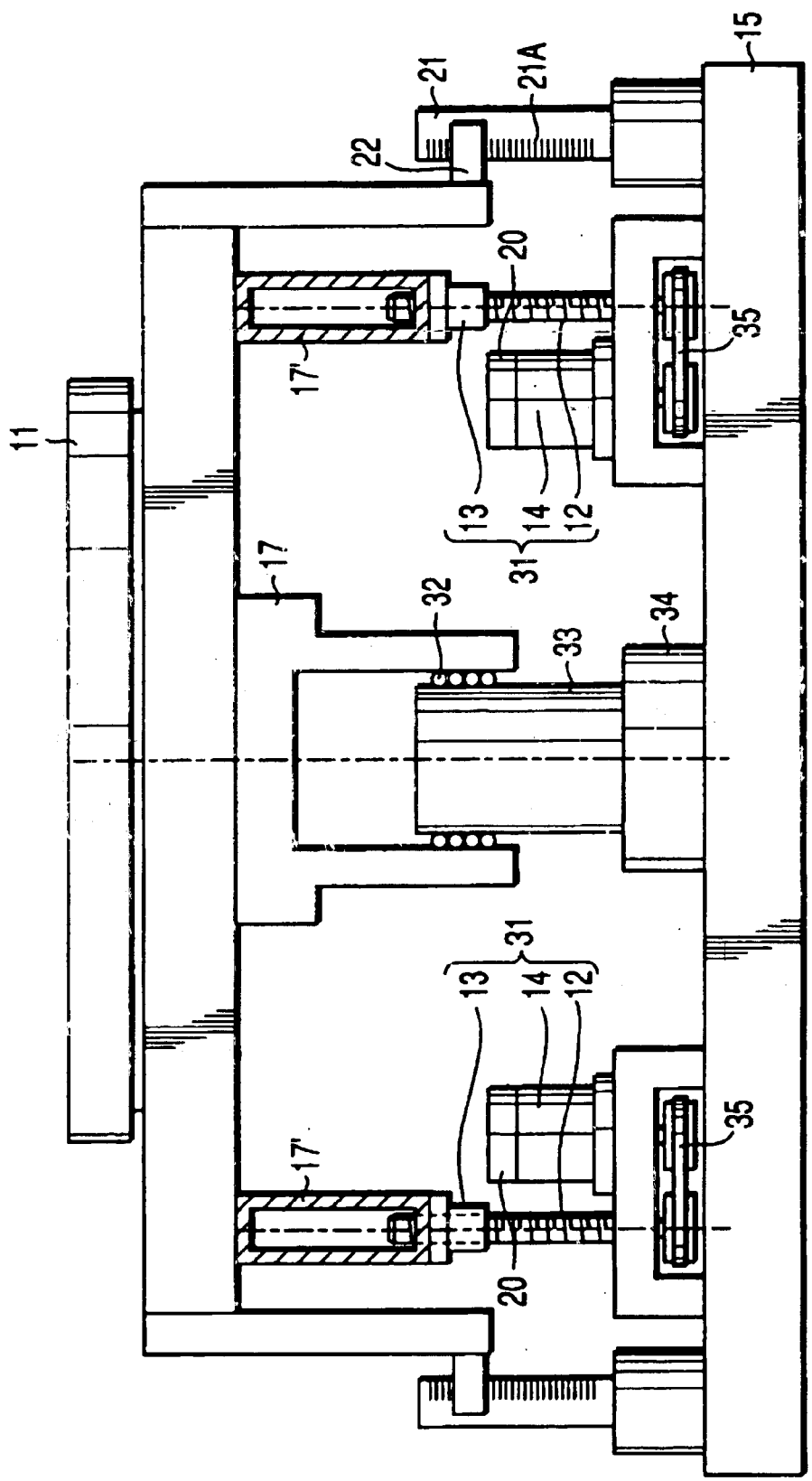
FIG. 5 is a cross sectional view showing a main portion of the inspecting apparatus according to another embodiment of the present invention.

In the embodiment shown in FIG. 5, a plurality of lift mechanisms are employed. Each lift mechanism includes a mechanism for measuring the pseudo overdriving amount and a mechanism for measuring the actual overdriving amount. It is possible to determine appropriately the number of such lift mechanisms, as required.

In the apparatus of the embodiment shown in FIG. 5, the sinking amount δ can be detected at a plurality of points of the wafer chuck. It is possible to obtain the needle load applied to each point of the wafer chuck on the basis of the detected sinking amount δ. Further, the needle load applied to the wafer chuck can be obtained by summing up the needle loads at these plural points.

As described above, according to the embodiment of the present invention shown in FIG. 5, it is possible to obtain in advance the relationship between the needle load applied to the wafer chuck 11 and the sinking amount δof the wafer chuck 11 caused by the needle load. Since the method in this embodiment comprises the step of bringing the to-be-inspected object into contact with a plurality of probes so as to obtain the sinking amount of the wafer chuck and the step of obtaining the needle load corresponding to the sinking amount, it is possible to monitor the needle load during the probe inspection on the real time basis. As a result, even if the probe card 19 is deformed by, for example, heat, it is possible to prevent the probe card 19 from being damaged.

It was customary in the past to set the overdriving amount for each probe card for inspecting the wafer W. In this embodiment, however, the relationship between the needle load and the sinking amount δ is obtained in advance and is displayed on the display device 23, making it possible to confirm the needle load on the display screen. It follows that the probe inspection can be performed while observing the present needle load. For example, when the inspection is performed with a needle load of 25 kg·f, the needle load is supplied through, for example, a key board to permit the control device 16 to perform control such that the difference (sinking amount δ between the pseudo overdriving amount of the rotary encoder 20 and the actual control amount of the linear encoder becomes 10 μm. Therefore, it is possible to set simply and accurately the needle load of 25 kg·f regardless of the kind of the probe card 19 used. It follows that it is possible to set the needle load of the probe card 19 at an accurate value prior to the inspection of the wafer W. Where the needle load deviates or is likely to deviate from the allowable range, the needle load is corrected to fall within the allowable range so as to carry out a predetermined inspection without fail.

The present invention is not limited at all to the embodiments described above. The basic idea of the present invention is to utilize the sinking phenomenon of the wafer chuck 11 caused by the needle load. The present invention covers the needle load measuring method, the needle load setting method, and the needle load detecting mechanism based on the basic idea given above. For example, where a stepping motor is used as the motor 14, the sinking amount δ (needle load) can be obtained by using the driving pulse of the stepping motor and the linear encoder 24 without using the rotary encoder 20.

According to the present invention, it is possible to monitor the contact state (needle load) between the to-be-inspected object and the probes on the real time basis so as to prevent the probe card, etc. from being damaged and to prevent a poor contact state between the to-be-inspected object and the probes.

According to the present invention, provided are a needle load setting method in which an appropriate needle load can be set prior to the inspection of the to-be-inspected object and a needle load detecting mechanism.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A probe apparatus for inspecting the electrical characteristics of a to-be-inspected object, comprising:
   a wafer chuck which places a to-be-inspected object thereon;
   a lift mechanism which vertically moves the wafer chuck;
   a plurality of probes provided above the wafer chuck and brought into electrical contact with a plurality of electrodes of the to-be-inspected object;
   a memory section storing previously obtained data representing a relationship between a needle load applied to the wafer chuck and a sinking amount of the wafer chuck caused by the needle load;
   a measuring mechanism which measures the sinking amount of the wafer chuck caused by the needle load applied by said plurality of probes, when the wafer chuck having the to-be-inspected object placed thereon is overdriven with respect to said plurality of probes by the lift mechanism; and
   an arithmetic processing section which obtains the needle load of said plurality of probes corresponding to the measured sinking amount based on the data representing the relationship between the needle load and the sinking amount, and the measured sinking amount,
   wherein the measuring mechanism comprises:
   a first detecting mechanism which detects a pseudo overdriving amount of the wafer chuck with respect to said plurality of probes;
   a second detecting mechanism which detects an actual overdriving amount of the wafer chuck with respect to said plurality of probes; and
   calculating means for calculating the sinking amount by subtracting the actual overdriving amount from the pseudo overdriving amount,
   where the pseudo overdriving amount refers to an amount of a lift of the wafer chuck which may be lifted due to overdriving when the needle load of said plurality of probes is not applied to the wafer chuck, and the actual overdriving amount refers to an amount of a lift of the wafer chuck which is actually lifted due to overdriving when the needle load of said plurality of probes is applied to the wafer chuck.

2. The probe apparatus according to claim 1, wherein the measuring mechanism measures the sinking amount at a plurality of points of the wafer chuck.

3. The probe apparatus according to claim 1, wherein the first detecting mechanism detects the pseudo overdriving amount from an amount of drive of the lift mechanism.

4. The probe apparatus according to claim 1, wherein the second detecting mechanism detects the actual overdriving amount by detecting a position in a vertical direction of the wafer chuck.

5. A method of measuring a needle load applied to a wafer chuck, in a probe apparatus comprising the wafer chuck which places a to-be-inspected object thereon and a plurality of probes provided above the wafer chuck and brought into electrical contact with a plurality of electrodes of the to-be-inspected object, when the wafer chuck is overdriven with respect to said plurality of probes, the method comprising:
   storing previously obtained data representing a relationship between a needle load applied to the wafer chuck and a sinking amount of the wafer chuck caused by the needle load;
   measuring the sinking amount of the wafer chuck caused by the needle load applied by said plurality of probes, when the wafer chuck having the to-be-inspected object placed thereon is overdriven with respect to said plurality of probes; and
   obtaining the needle load of said plurality of probes corresponding to the measured sinking amount based on the data representing the relationship between the needle load and the sinking amount, and the measured sinking amount,
   wherein the measuring the sinking amount comprises:
   detecting a pseudo overdriving amount of the wafer chuck, the pseudo overdriving amount referring to an amount of a lift of the wafer chuck which may be lifted due to overdriving when the needle load of said plurality of probes is not applied to the wafer chuck;
   detecting an actual overdriving amount of the wafer chuck, the actual overdriving amount referring to an amount of a lift of the wafer chuck which is actually lifted due to overdriving when the needle load of said plurality of probes is applied to the wafer chuck; and
   calculating the sinking amount by subtracting the actual overdriving amount from the pseudo overdriving amount.

6. A method of inspecting electric characteristics of a to-be-inspected object by overdriving a wafer chuck with respect to a plurality of probes, in a probe apparatus comprising the wafer chuck which places a to-be-inspected object thereon and the plurality of probes provided above the wafer chuck and brought into electrical contact with a plurality of electrodes of the to-be-inspected object, the method comprising:

storing previously obtained data representing a relationship between a needle load applied to the wafer chuck and a sinking amount of the wafer chuck caused by the needle load;

presetting a value of a needle load to be applied to the to-be-inspected object by overdriving;

measuring the sinking amount of the wafer chuck caused by the needle load applied by said plurality of probes, when the wafer chuck having the to-be-inspected object placed thereon is overdriven with respect to said plurality of probes;

obtaining the needle load of said plurality of probes corresponding to the measured sinking amount based on the data representing the relationship between the needle load and the sinking amount, and the measured sinking amount; and adjusting an overdriving amount such that the obtained needle load falls within a permissible range of the preset value of the needle load obtained when the electric characteristics of the to-be-inspected object are inspected, wherein the measuring the sinking amount comprises:

detecting a pseudo overdriving amount of the wafer chuck, the pseudo overdriving amount referring to an amount of a lift of the wafer chuck which may be lifted due to overdriving when the needle load of said plurality of probes is not applied to the wafer chuck;

detecting an actual overdriving amount of the wafer chuck, the actual overdriving amount referring to an amount of a lift of the wafer chuck which is actually lifted due to overdriving when the needle load of said plurality of probes is applied to the wafer chuck; and calculating the sinking amount by subtracting the actual overdriving amount from the pseudo overdriving amount.

7. A probe apparatus for inspecting the electrical characteristics of a to-be-inspected object, comprising:

a wafer chuck which places a to-be-inspected object thereon;

a lift mechanism which vertically moves the wafer chuck;

a plurality of probes provided above the wafer chuck and brought into electrical contact with a plurality of electrodes of the to-be-inspected object;

a memory section storing previously obtained data representing a relationship between a needle load applied to the wafer chuck and a sinking amount of the wafer chuck caused by the needle load;

a measuring mechanism which measures the sinking amount of the wafer chuck caused by the needle load applied by said plurality of probes, when the wafer chuck having the to-be-inspected object placed thereon is overdriven with respect to said plurality of probes by the lift mechanism; and an arithmetic processing section which obtains the needle load of said plurality of probes corresponding to the measured sinking amount based on the data representing the relationship between the needle load and the sinking amount, and the measured sinking amount, wherein the measuring mechanism comprises:

a first detecting mechanism which detects a pseudo overdriving amount of the wafer chuck with respect to said plurality of probes;

a second detecting mechanism which detects an actual overdriving amount of the wafer chuck with respect to said plurality of probes; and an arithmetic processing section which calculates the sinking amount by subtracting the actual overdriving amount from the pseudo overdriving amount, where the pseudo overdriving amount refers to an amount of a lift of the wafer chuck which may be lifted due to overdriving when the needle load of said plurality of probes is not applied to the wafer chuck, and the actual overdriving amount refers to an amount of a lift of the wafer chuck which is actually lifted due to overdriving when the needle load of said plurality of probes is applied to the wafer chuck.

8. The probe apparatus according to claim 7, wherein the measuring mechanism measures the sinking amount at a plurality of points of the wafer chuck.

9. The probe apparatus according to claim 7, wherein the first detecting mechanism detects the pseudo overdriving amount from an amount of drive of the lift mechanism.

10. The probe apparatus according to claim 7, wherein the second detecting mechanism detects the actual overdriving amount by detecting a position in a vertical direction of the wafer chuck.

* * * * *